US012687568B2

(12) United States Patent　　　(10) Patent No.:　US 12,687,568 B2

Hodzic et al.　　　(45) Date of Patent:　　Jul. 21, 2026

(54) METHOD AND PROCESS OF FAULT DETECTION IN POWER SYSTEMS USING MACHINE LEARNING FEATURE EXTRACTION

(71) Applicant: ARTI ANALYTICS, INC., Morgan Hill, CA (US)

(72) Inventors: Migdat Hodzic, San Jose, CA (US); Tarik Hubana, Sarajevo (BA)

(73) Assignee: ARTI ANALYTICS, INC., Morgan Hill, CA (US)

( * ) Notice: Subject to any disclaimer, the term of this patent is extended or adjusted under 35 U.S.C. 154(b) by 0 days.

(21) Appl. No.: 19/003,367

(22) Filed: Dec. 27, 2024

(65) Prior Publication Data

US 2026/0118399 A1　　Apr. 30, 2026

Related U.S. Application Data

(60) Provisional application No. 63/684,789, filed on Aug. 19, 2024.

(51) Int. Cl.
G01R 31/08 (2020.01)

(52) U.S. Cl.
CPC .......... G01R 31/088 (2013.01); G01R 31/086 (2013.01)

(58) Field of Classification Search
CPC ............................ G01R 31/088; G01R 31/086
See application file for complete search history.

(56) References Cited

U.S. PATENT DOCUMENTS

| | | | | |
|---|---|---|---|---|
| 6,529,010 B1 * | 3/2003 | Saha | .................... | G01R 31/085 |
| | | | | 324/521 |
| 7,693,608 B2 * | 4/2010 | Nasle | ................. | G05B 23/0272 |
| | | | | 706/14 |

(Continued)

FOREIGN PATENT DOCUMENTS

| | | | | | |
|---|---|---|---|---|---|
| CN | 113850330 | * | 12/2021 | ............... | G06K 9/46 |
| CN | 116244567 | * | 6/2023 | ............. | G06F 17/15 |
| KR | 20150037266 | * | 4/2015 | ............. | G01R 31/02 |

OTHER PUBLICATIONS

Y. Wang, M. Liu and Z. Bao, "Deep learning neural network for power system fault diagnosis," 2016 35th Chinese Control Conference (CCC), Chengdu, China, 2016, pp. 6678-6683.

(Continued)

*Primary Examiner* — Catherine T. Rastovski
*Assistant Examiner* — Sharah Zaab
(74) *Attorney, Agent, or Firm* — Stephen E. Zweig

(57)　　　　　ABSTRACT

Method and process of fault detection in power systems using feature extraction from the measurements of the voltages and currents in the power system, as well as machine learning methods. A computer processor, such as an industrial computer, is connected to various voltage and current measurement systems in various locations. This, in turn, is connected to a server computer and control system. Electrical power fault signals (features) propagating through the power system network are analyzed using various measurements and feature extraction methods. These can be used to detect, classify, and localize the fault. The present methods are particularly useful for hard-to-analyze faults such as high impedance faults and faults occurring due to inrush currents, bidirectional power flows, and islanding issues.

15 Claims, 8 Drawing Sheets

(56) References Cited

U.S. PATENT DOCUMENTS

| | | | | |
|---|---|---|---|---|
| 11,176,442 B1 | 11/2021 | Liu et al. | | |
| 11,480,594 B2 | 10/2022 | Gu et al. | | |
| 11,527,891 B2 | 12/2022 | Dehganian et al. | | |
| 11,656,263 B2 * | 5/2023 | Cui | H02H 7/22 | |
| | | | 702/58 | |
| 2003/0155929 A1 * | 8/2003 | Choi | G01R 31/085 | |
| | | | 324/509 | |
| 2004/0036478 A1 * | 2/2004 | Logvinov | H02J 13/00002 | |
| | | | 324/534 | |
| 2014/0240881 A1 * | 8/2014 | Brombach | H02H 7/222 | |
| | | | 361/65 | |
| 2015/0346286 A1 * | 12/2015 | Janssen | H02J 3/00 | |
| | | | 702/58 | |
| 2019/0219994 A1 | 7/2019 | Yan et al. | | |
| 2021/0141355 A1 * | 5/2021 | Duan | G06N 3/08 | |
| 2022/0140597 A1 | 5/2022 | Pal et al. | | |
| 2024/0030696 A1 | 1/2024 | Naidu et al. | | |

OTHER PUBLICATIONS

H. A. Tokel, R. A. Halaseh, G. Alirezaei and R. Mathar, "A new approach for machine learning-based fault detection and classification in power systems," 2018 IEEE Power & Energy Society Innovative Smart Grid Technologies Conference (ISGT), Washington, DC, USA, 2018, pp. 1-5.

Yousuf, H., Zainal, A.Y., Alshurideh, M., Salloum, S.A. (2021). Artificial Intelligence Models in Power System Analysis. In: Hassanien, A., Bhatnagar, R., Darwish, A. (eds) Artificial Intelligence for Sustainable Development: Theory, Practice and Future Applications. Studies in Computational Intelligence, vol. 912. Springer, Cham.

A. Zainab, S. S. Refaat, D. Syed, A. Ghrayeb and H. Abu-Rub, "Faulted Line Identification and Localization in Power System using Machine Learning Techniques," 2019 IEEE International Conference on Big Data (Big Data), Los Angeles, CA, USA, 2019, pp. 2975-2981.

Iqbal, M., Madan, A.K. "Artificial Intelligence-Based Bearing Fault Diagnosis of Rotating Machine to Improve the Safety of Power System". In: Malik, H., Mishra, S., Sood, Y.R., Iqbal, A., Ustun, T.S. (eds) Renewable Power for Sustainable Growth. ICRP 2023. Lecture Notes in Electrical Engineering, vol. 1086. Springer, Singapore, 2024.

H. Livani and C. Y. Evrenosolu, "A Fault Classification and Localization Method for Three-Terminal Circuits Using Machine Learning," in IEEE Transactions on Power Delivery, vol. 28, No. 4, pp. 2282-2290, Oct. 2013.

J.Y. Ishihara, M.H. Terra, , J.C.T. Campos, "Robust Kalman Filter for Descriptor Systems". IEEE Transactions on Automatic Control. 51 (8): 1354, 2006.

J. B. Allen and L. R. Rabiner, "A unified approach to short-time Fourier analysis and synthesis", Proc. IEEE, vol. 65, pp. 1558-1564, Nov. 1977.

* cited by examiner

METHOD AND PROCESS OF FAULT DETECTION IN POWER SYSTEMS USING MACHINE LEARNING FEATURE EXTRACTION

CROSS-REFERENCE TO RELATED APPLICATIONS

This application claims the priority benefit of U.S. provisional patent application No. 63/684,789, filed Aug. 19, 2024, the entire contents of which are incorporated herein by reference.

BACKGROUND OF THE INVENTION

Field of the Invention

The present invention is related to the protection of power systems. More particularly, the invention relates to the detection, classification, and location of faults in radial and meshed network topology,

Description of the Related Art

With the advancement of technology, electrical power systems evolved as well. Nowadays, power systems are far from the point they were once they were designed. New technologies such as renewable, non-dispatchable energy sources, electric vehicles with vehicle-to-grid power flow, and growing requirements regarding the security of supply have put a challenging task in front of the grid operators.

The fault in a power network is an unpermitted variation from its normal operating situations. It may be created for various reasons, such as the electrical lines contact that creates a short circuit, quick connection of animals or birds, or accidental contact due to wind and trees. A fault makes the current pass in an incorrect path, destroying the equipment and interrupting power. Traditional fault location techniques for distribution systems are based on overcurrent protection relays and calls from customers who experienced the outage. Then, a maintenance crew patrols the area looking for fault indications and ensures protection before the faulted section is reconfigured. The complete restoration method can take several hours.

Another challenge faced by protection engineers in power systems is dynamic behaviors and infeed currents from intermittent resources. This is because the infeed currents can offset conventional protection schemes. An additional challenge is to detect the high-impedance faults that typically occur when an energized conductor encounters ground through any high-impedance objects. The probability of occurrence of high impedance fault in distribution networks is higher than in transmission networks because distribution feeders are more likely to encounter high impedance objects like trees, etc. However, in underground cables, high-impedance faults are caused by insulation degradation that exposes the energized conductor to high-impedance objects. High impedance faults are extremely difficult to detect and isolate by conventional protection schemes, because the fault current magnitude is much lower than nominal current.

The intermittent connections and disconnections of dynamic loads, such as electric vehicles, create transient conditions that traditional fault detection systems struggle to handle. Finally, the operation of microgrids that allow certain parts of the grid to work in both islanded, and grid-connected modes introduces uncertainty in traditional protection schemes. All these variations challenge conventional fault detection methods designed for more static grid configurations.

In this context, traditional protection relays face drawbacks in adapting to the dynamic and diverse conditions of modern electrical power networks. First, their reliance on fixed thresholds and predetermined fault signatures may not effectively accommodate new variability. Second, protection relays are often designed with assumptions about the stability and predictability of grid behavior, which may not hold in the operation of modern power systems. Finally, the sheer volume and complexity of data generated in modern networks may overwhelm traditional protection relay systems, hindering their ability to provide accurate and timely fault detection. As a result, there is a growing need for advanced technologies, such as artificial intelligence and machine learning, to enhance fault detection capabilities in these dynamic and complex environments.

PRIOR ART

Multiple techniques and technologies have been developed to address the complex fault detection and classification in power systems. Due to the limitations or drawbacks of conventional techniques, it is no surprise that many researchers and inventors contributed to the existing body of knowledge by utilizing feature extraction (or the inputs preprocessing) procedures by using different signal processing methodologies such as Fourier transform, wavelet transform or Hilbert-Huang transform paired with artificial intelligence. However, the selection of artificial intelligence models also varies among inventors and researchers, such as support vector machines, artificial neural networks, K-nearest neighbor, and deep reinforcement learning.

Previous US patents and patent applications in this area include U.S. Pat. No. 7,693,608, US 2019/0219994, U.S. Pat. Nos. 11,527,891, 11,176,442, 11,656,263, 11,480,594, US 2024/0030696, and US 2022/0140597.

Relevant research publications include:

Y. Wang, M. Liu and Z. Bao, "Deep learning neural network for power system fault diagnosis," 2016 35th Chinese Control Conference (CCC), Chengdu, China, 2016, pp. 6678-6683, H. A. Tokel, R. A. Halaseh, G. Alirezaei and R. Mathar, "A new approach for machine learning-based fault detection and classification in power systems," 2018 IEEE Power & Energy Society Innovative Smart Grid Technologies Conference (ISGT), Washington, DC, USA, 2018, pp. 1-5, Yousuf, H., Zainal, A. Y., Alshurideh, M., Salloum, S. A. (2021). Artificial Intelligence Models in Power System Analysis. In: Hassanien, A., Bhatnagar, R., Darwish, A. (eds) Artificial Intelligence for Sustainable Development: Theory, Practice and Future Applications. Studies in Computational Intelligence, vol 912. Springer, Cham A. Zainab, S. S. Refaat, D. Syed, A. Ghrayeb and H. Abu-Rub, "Faulted Line Identification and Localization in Power System using Machine Learning Techniques," 2019 IEEE International Conference on Big Data (Big Data), Los Angeles, CA, USA, 2019, pp. 2975-2981, Iqbal, M., Madan, A. K. "Artificial Intelligence-Based Bearing Fault Diagnosis of Rotating Machine to Improve the Safety of Power System". In: Malik, H., Mishra, S., Sood, Y. R., Iqbal, A., Ustun, T. S. (eds) Renewable Power for Sustainable Growth. ICRP 2023. Lecture Notes in Electrical Engineering, vol 1086. Springer, Singapore, 2024

H. Livani and C. Y. Evrenosoğlu, "A Fault Classification and Localization Method for Three-Terminal Circuits Using Machine Learning," in IEEE Transactions on Power Delivery, vol. 28, no. 4, pp. 2282-2290 October 2013, J. Y. Ishihara, M. H. Terra, J. C. T. Campos, "Robust Kalman Filter for Descriptor Systems". IEEE Transactions on Automatic Control. 51 (8): 1354, 2006

J. B. Allen and L. R. Rabiner, "A unified approach to short-time Fourier analysis and synthesis", Proc. IEEE, vol. 65, pp. 1558-1564 November 1977.

BRIEF SUMMARY OF THE INVENTION

While the prior art presents various methods for fault detection and diagnosis in power systems, none of them provide all the functionalities and none follow the novel feature extraction methods used in this invention. Even with the innovative solutions presented above, unconfirmed or undescribed operating scenarios should be covered, such as vehicle-to-grid electric vehicles, abrupt load changes, or islanded operation of microgrids. Therefore, the system concept and architecture that includes specific feature extraction methods based on short-time Fourier transform and Kalman filter innovation sequence algorithms proves to be sensitive to more diverse types of faults and a cost-efficient upgrade of existing infrastructure.

The present invention is related to protection of power systems. More particularly, the invention relates to the detection, classification and location of faults in radial (method 1) and meshed (method 2) network topology, including high impedance faults that are present in modern distribution systems, faults in systems with integrated distributed or intermittent generators and faults in microgrids that operate in both islanded and grid-connected mode.

The invention disclosed herein provides fault detection, classification, and localization capabilities in power systems through a sophisticated blend of machine learning and feature extraction techniques. Traditional protection schemes face significant challenges in detecting faults amidst the growing integration of intermittent renewable energy sources and new modes of grid operation. It is, therefore, an object of the present invention to provide a method and process tailored for the modern power landscape, leveraging data from voltage and current measurements within power substations by employing artificial intelligence methods and enabling precise fault detection, classification, and localization.

In accordance with the purpose of the invention, as embodied and broadly described herein, central to the innovation is its ability to detect a wide array of fault types, including high impedance faults, inrush current faults, bidirectional power flow faults, and islanding issues. Unlike conventional methods, which may struggle with such complex fault scenarios, the proposed approach exhibits higher sensitivity and reliability. This improved sensitivity is achieved through the comprehensive analysis of frequency-domain features, time-domain features, and statistical features extracted from the voltage and current measurements. By scrutinizing these diverse features, the system can distinct subtle fault patterns and deviations from normal operating conditions, thus addressing potential disruptions to the power system's integrity, as shown in FIGS. 3, 4, 6 and 7.

The invention comprises of the method and procedure that operates in collaboration with measuring equipment in the power station, remote host computer executing an algorithm described herein (inference), communication system capable of communicating and exchanging data or system commands between host computer, server computer, system operator (SCADA/EMS) and control equipment (circuit breakers) and server computer that learns from measurements and simulation scenarios (training), as shown in FIG. 1 and FIG. 5.

Upon detecting a fault, the system promptly issues trip signals to protection equipment and/or human system operators, facilitating swift intervention and minimizing the risk of cascading failures, as shown in FIG. 2. This proactive approach not only safeguards critical infrastructure but also enhances the overall resilience and reliability of the power grid in the face of mounting challenges posed by renewable energy integration and evolving operational modes of modern power systems.

Thus, in some embodiments, the invention may be:

1. A system and method of providing cost effective improvement of failure detections over/of the prior art protection schemes. This may be based on more effective usage of already present measurements of voltages and currents and circuit (as shown in FIG. 1 and FIG. 5) breakers used in power systems, or additional conventional measuring equipment, as needed.

2. A system and method of providing a higher sensitivity detect to more diverse type of faults including complex faults that have infeed currents from various distributed resources.

3. A system and method of providing an improved adaptability and robustness to various dynamic load changes that are present in modern power distribution systems.

4. A system and method of providing higher sensitivity to high-impedance faults that are almost nondetectable with current protection devices, as well as enhanced adaptability to islanded operation of microgrids in the system.

5. An AI-based, robust and adaptable method and process for power fault detection (as shown in FIG. 2).

6. A system and method of feature extraction method based on Short Time Fourier Transform and Kalman filter innovation sequences (as shown in FIGS. 3, 4, 6 and 7).

Put alternatively, in some embodiments, the invention may be a system and method of automatically detecting faults in at least one real-world electrical power network. This often comprises obtaining a plurality of voltage and current measurements at a plurality of times and locations in this real-world electrical power network, and then transmitting these measurements as input to at least one monitoring computer system.

This monitoring computer system is typically configured to use at least one artificial intelligence system to analyze these measurements for a presence of at least one feature that (historically, or statistically, or by previous modeling experiments) is associated with at least one type of fault.

This at least one artificial intelligence system typically comprises at least one artificial intelligence/machine learning model trained with at least some information about the layouts, components, and electrical properties of this at least one real-world electrical power network, as well as information about how this at least one type of said fault alters at least some the various plurality of voltage and current measurements.

The invention then uses this at least one artificial intelligence system to output information about any of the types, network locations, times, and severity of this at least one type of fault.

In some embodiments, when the electrical power network is a radial type network, the invention may analyze these measurements using at least one short time Fourier Transform.

In other embodiments, when the electrical power network is a meshed type network, the invention may further analyze these measurements using at least one Kalman Filter.

BRIEF DESCRIPTION OF THE DRAWINGS

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

Figure 1:
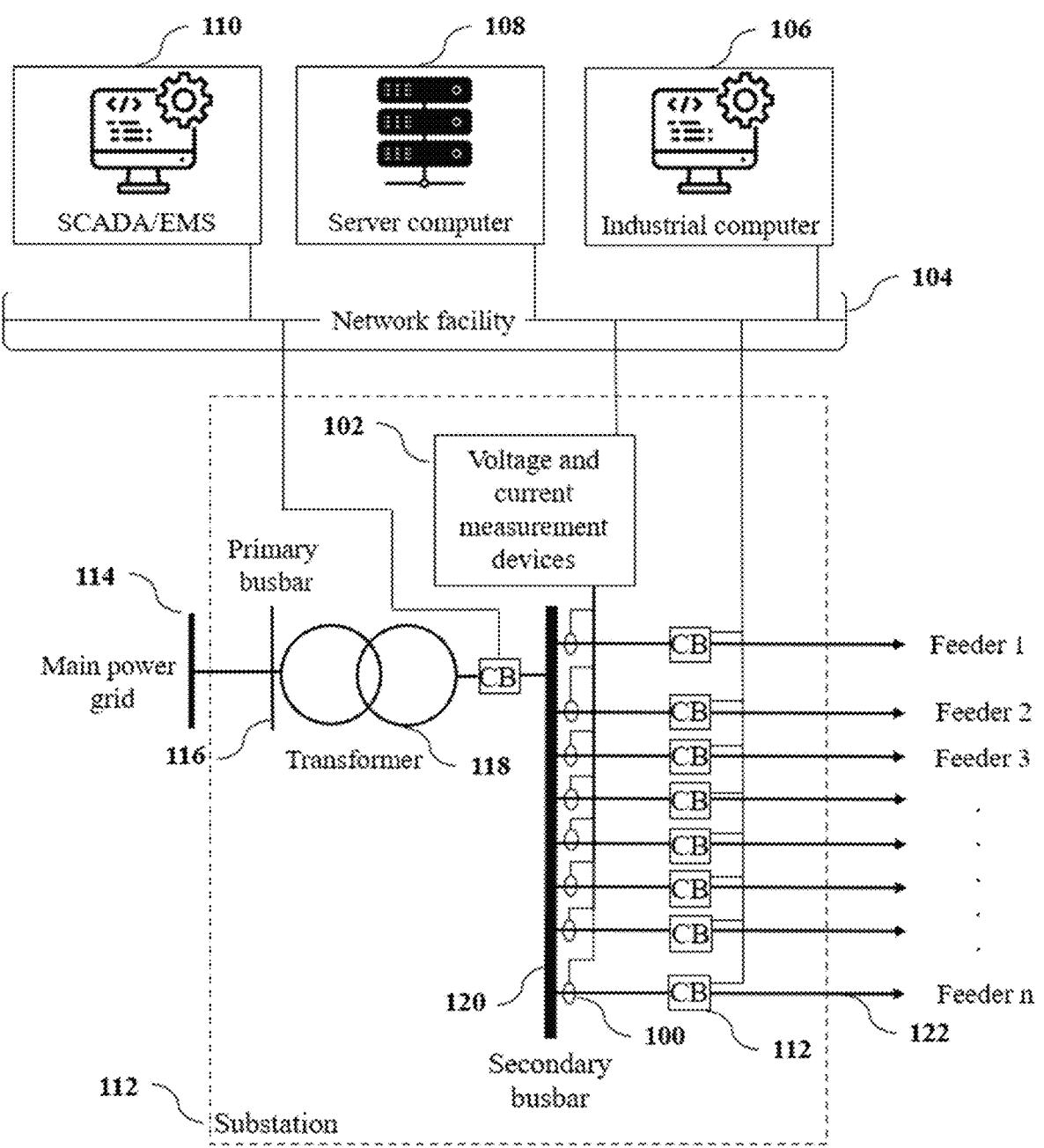
FIG. 1. is a diagram illustrating a preferred embodiment of the invention using method 1, depicting essential operative elements and the equipment of the system and integration in the power system in accordance with the present invention.

As previously discussed, in some embodiments, the invention may be a system and method of automatically detecting faults in at least one real-world electrical power network. This often comprises obtaining a plurality of voltage and current measurements at a plurality of times and locations in this real-world electrical power network, and then transmitting these measurements as input to at least one monitoring computer system.

This monitoring computer system is typically configured to use at least one artificial intelligence system to analyze these measurements for a presence of at least one feature that (historically, or statistically, or by previous modeling experiments) is associated with at least one type of fault.

This at least one artificial intelligence system typically comprises at least one artificial intelligence/machine learning model trained with at least some information about the layouts, components, and electrical properties of this at least one real-world electrical power network, as well as information about how this at least one type of said fault alters at least some the various plurality of voltage and current measurements.

The invention then uses this at least one artificial intelligence system to output information about any of the types, network locations, times, and severity of this at least one type of fault.

Note that in a preferred embodiment, at least some information about the layout, components, and electrical properties of the real-world electrical power network, as well as information about how one or more faults alters at least some of the various voltage and current measurements, can comprises information encoded in the neural network; and/or at least one computerized circuit simulator operating upon at least one computer model of at least a portion of the layout, components, and electrical properties of the real-world electrical power network.

Various types of artificial neural networks (ANN) may be used for the invention. These will generally include large language models (LLM), exemplified by the Meta Llama-3-70B LLM series. In general, any type of trainable neural net hardware and software may be used, including GPU (graphics processing units), neural processing units (NPU), deep learning processors (DPU) and the like. Suitable topologies include convolutional neural networks (CNN), generative adversarial networks, generative AI, and the like.
Method 1. Based on Short Time Fourier Transform for Radial Power System Topologies Prior art radial power system distribution system feeders are typically protected using overcurrent relays that cannot detect complex faults that occur in power systems with distributed generation (photovoltaics, vehicle to grid electric vehicles). In particular, existing protection schemes are not adaptable to dynamic load changes that are present in modern distribution system. Further, high-impedance faults (such as breaks or shorts in underground power lines) are not detectable due to small change in the measured current and voltage. Another problem is that existing protection schemes typically don't work in islanded operation of microgrids in the system. Another problem is that according to the prior art, protection of radial distribution systems with advanced protection relays (such as those that are used in high voltage systems) is expensive and often not suitable for such purposes.

As will be discussed in more detail shortly, the invention is designed for higher sensitivity to complex faults that have infeed currents from distributed resources. The idea is to achieve higher adaptability and robustness to dynamic load changes that are present in modern distribution systems, as well as to achieve higher sensitivity to high-impedance faults that are almost nondetectable with current protection devices. Other objectives are enhanced adaptability to islanded operation of microgrids in the system, and cost-efficiency through upgrade of existing protection equipment by using the already present measurements of voltages and currents and circuit breakers or additional conventional measuring equipment used in power systems if required.
Overview of Operation:

In some embodiments, the system may use existing measurements (and new additional if required) from the power substation (current and voltage measurements for each phase), the system sends the data via a communication interface to at least one local industrial and cloud server computer. This local industrial computer may often have a pre-trained artificial intelligence model that is used for inference: fault detection, classification, faulty feeder selection and fault localization. In some embodiments, one or more server computers may also be use used for AI training. These may also have a pre-trained artificial intelligence model based on simulation scenarios that is regularly updated and trained with new data.

In a preferred embodiment, an upgraded artificial intelligence model from the server computer may be automatically deployed to the local industrial computer once the server model is updated with new knowledge. Usually collected measurements of currents and voltages (phase measurements) are preprocessed to extract features from the raw measurements by using the various algorithms, such as a short-term Fourier transform, in both the server and the industrial computer.

Typically, the system is configured to monitor the currents and voltages at the substation (or other defined location) over a sliding time window and constantly send the data to both the server and industrial computer. The local industrial computer uses at least one pre-trained artificial intelligence model to detect and classify the fault, as well as detect the faulty feeder and localize the fault.

Once the fault is detected, classified, and the faulty feeder determined, the trip signal to the relevant circuit breakers is sent to isolate the faulty system part, or a signal to a Supervisory Control and Data Acquisition (SCADA)/Energy Management System (EMS) system can also be sent for further action. In a preferred embodiment, the local industrial computer will always have the latest pre-trained AI model, and thus can work even without communication interface to the server computer.

As previously discussed, and as will also be discussed in more detail shortly, some of the main components and sub-systems include current transformers (for measurement), voltage transformers (for measurement), communication interfaces, local industrial computer for inference, server computer for training, network connections (such as to the internet).

Some of the system capabilities thus include: detection of faults in the power system, classification of fault type (single phase to ground, double phase to ground, three phase to ground, etc.), detection of any faulty radial feeders in the system, localization of fault on any radial feeder, sending fault information to the SCADA/EMS system, and sending trip signals to the relevant circuit breakers.

FIG. 1 shows the preferred embodiment of the invention described herein connected to one substation 112 in power system 114. Power system substation typically consists of primary busbars 116, power transformer 118, and secondary busbars 120 with feeders 122. The method is intended for the radial system topologies, but there are no limitations for its usage on meshed power systems. Power system substations in modern power systems as a rule have measurements of voltages and currents in all feeders 100. These measurements are usually obtained through voltage and currents transformers, but also through more advanced measuring equipment 102. If no compatible measuring equipment is installed, new additional measurements can be required. All measurements are monitored over the predefined sliding time window. With partial measurements, the system will be able to detect that the fault happened, but not to determine the faulty feeder, or to estimate the fault location on feeders without measurements. Regardless of the measuring method, the voltages and currents are collected, digitalized and sent via communication interface 104 to local industrial computer 106, cloud server computer 108 and SCADA/EMS system 110 (if there is a SCADA/EMS). Local industrial computer has a pre-trained artificial intelligence model that is used for inference. Inference model takes the measurements and based on them determines if the fault happened (fault detection), which type of fault happened (classification), where the fault happened (faulty feeder selection) and at what distance from the substation the fault happened (fault localization). Model response time is in range of couple milliseconds on standard industrial computer hardware, which means it can be used for real time protection coordination.

In parallel to the constant monitoring of the real-time measurements, these measurements are sent to the server computer 108. Server computer is used for training and has a pre-trained artificial intelligence model based on simulation scenarios that is regularly updated and trained with new data. Due to lengthy and resource demanding training procedure, a more powerful server computer is constantly updating (retraining) the model with new incoming data to make the AI model fit for the particular system that is being monitored and more robust to dynamic changes in the monitored power system. The upgraded artificial intelligence model from the server computer gets automatically deployed to the local industrial computer 106 once it is updated with new knowledge. Once the fault is detected, classified, and faulty feeder detected, the trip signal to circuit breaker 112 (CB) is sent to isolate the faulty system part, or the signal to SCADA/EMS system 110 is sent for further action. Following the method described herein, the local industrial computer always has the latest pre-trained model and can work even without communication interface to server computer.

As will be discussed in more detail below, in some embodiments, the monitoring computer system can be used to analyze the various voltage and current measurements over at least some of the plurality of times and locations and types of said fault by analyzing the voltage and current measurements according to at least one sliding time window, producing sliding window raw measurements for at least some of said locations. For example, these sliding window raw measurements may comprise a given voltage and currents as a function of time at a given location and type of fault.

For at least some of these locations, the system and method disclosed herein will then analyze these sliding window raw measurements using a Short-Time Fourier Transform (STFT), thus producing STFT frequency matrices. The invention will further use these STFT frequency matrices to determine their corresponding real component matrices and imaginary component matrices for at least some of the various locations and types of faults.

The system and method disclosed herein then vectorize these real component matrices and imaginary component matrices, producing a plurality of real component vectors and imaginary component vectors for at least some fault locations and types. The disclosed system and method then uses at least some of these various real and imaginary component vectors and their corresponding locations to train at least one artificial intelligence system and/or as input to the monitoring computer system.

As will shortly be discussed in more detail, in some embodiments, this STFT approach is particularly useful when the electrical power network can comprise a radial system topology.

Figure 2:
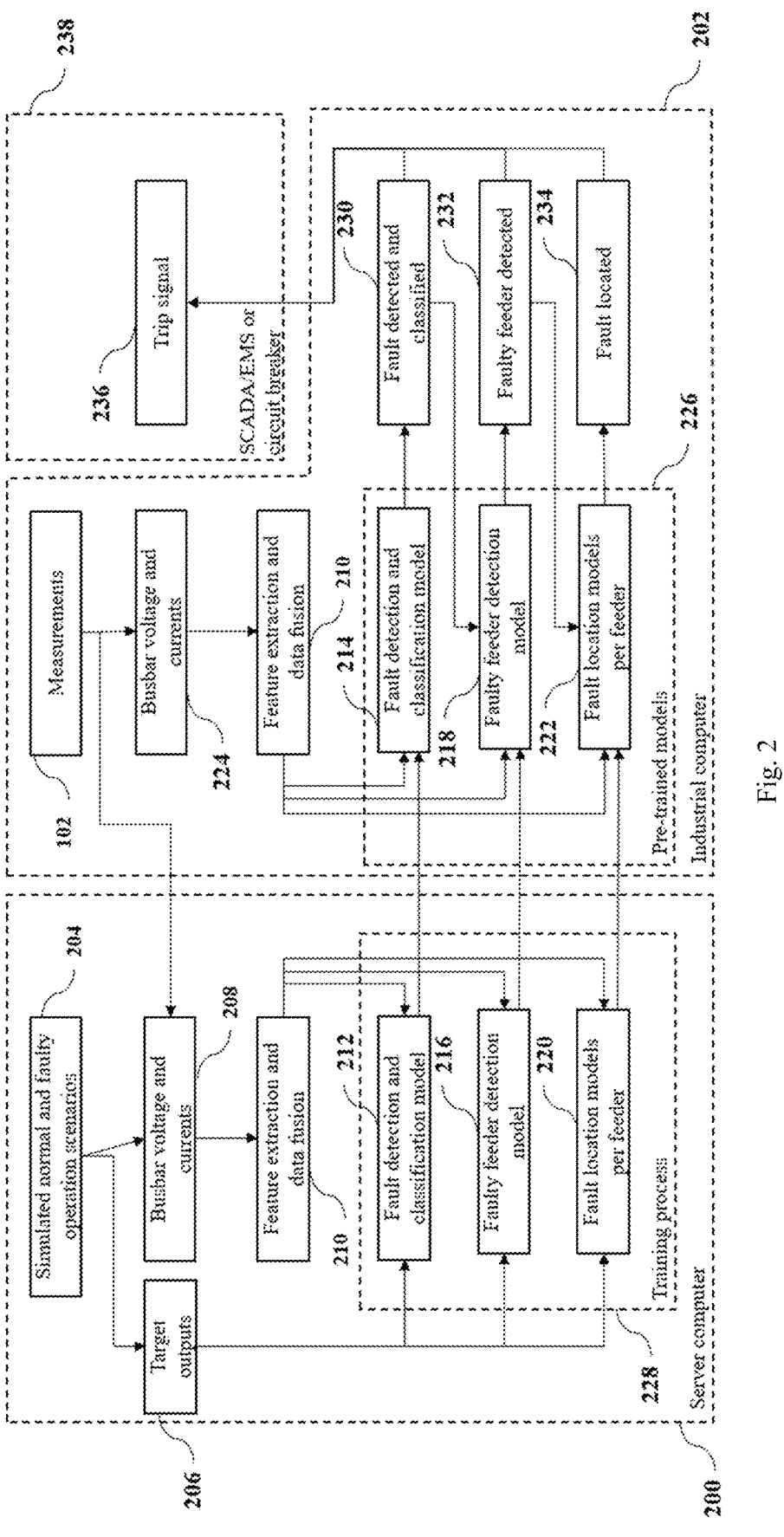
FIG. 2. is a block diagram depicting the artificial intelligence-based fault detection, classification and localization (both methods) implemented in accordance with the present invention.

FIG. 2. shows the algorithm of the invention described herein based on the short-term Fourier transform. The diagram is broken down in two sections: server computer algorithm 200 and industrial computer algorithm 202. Due to the nature of the power system protection coordination and tuning, all traditional methods include calculations or simulations of the power system operation to set up the threshold values and protection parameters in the protection equipment. In the invention described herein, the simulation of the power system operating scenarios including normal and faulty scenarios is performed 204 and voltages and currents are collected 100, 102 in the same manner like in the preferred embodiment of the invention applied to the real monitored power system. In the simulated scenarios, the target outputs 206 are known, and forwarded to models for training. Additionally, real-time measurements from the measuring equipment 102 are blended with the simulated values to update the model accuracy, as described above. Collected and merged measurements of currents and voltages 208 are preprocessed to extract features 210 from the raw measurements by using the short-term Fourier transform.

A further discussion of various simulation techniques can be found in FIG. 8, as well as in a more detailed simulation discussion later in this disclosure.

Figure 3:
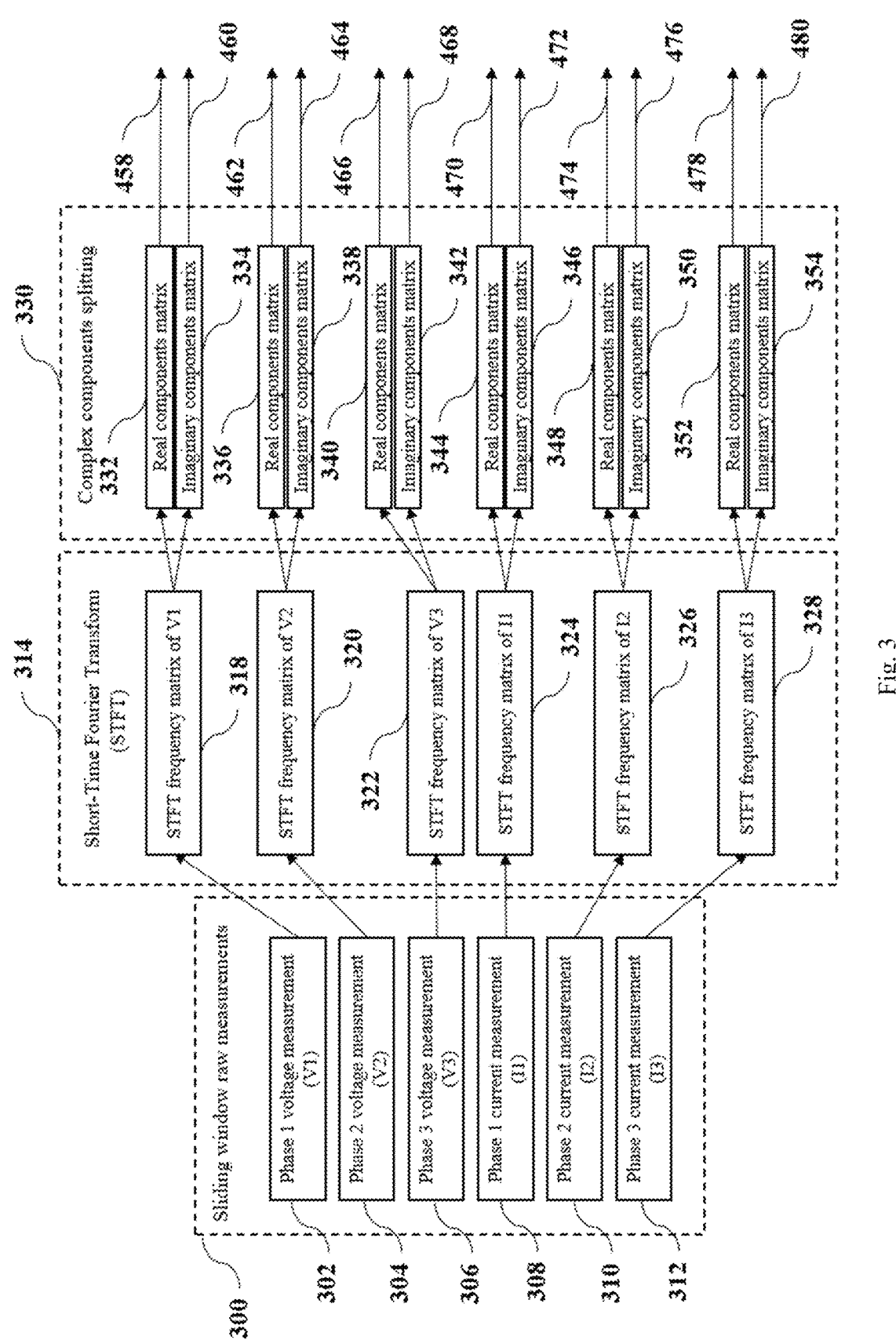
FIG. 3. is a block diagram depicting the feature extraction method for method 1 based on STFT in accordance with the present invention, including first part of the feature extraction procedure covering sliding window raw measurements, STFT preprocessing and complex components splitting.
Figure 4:
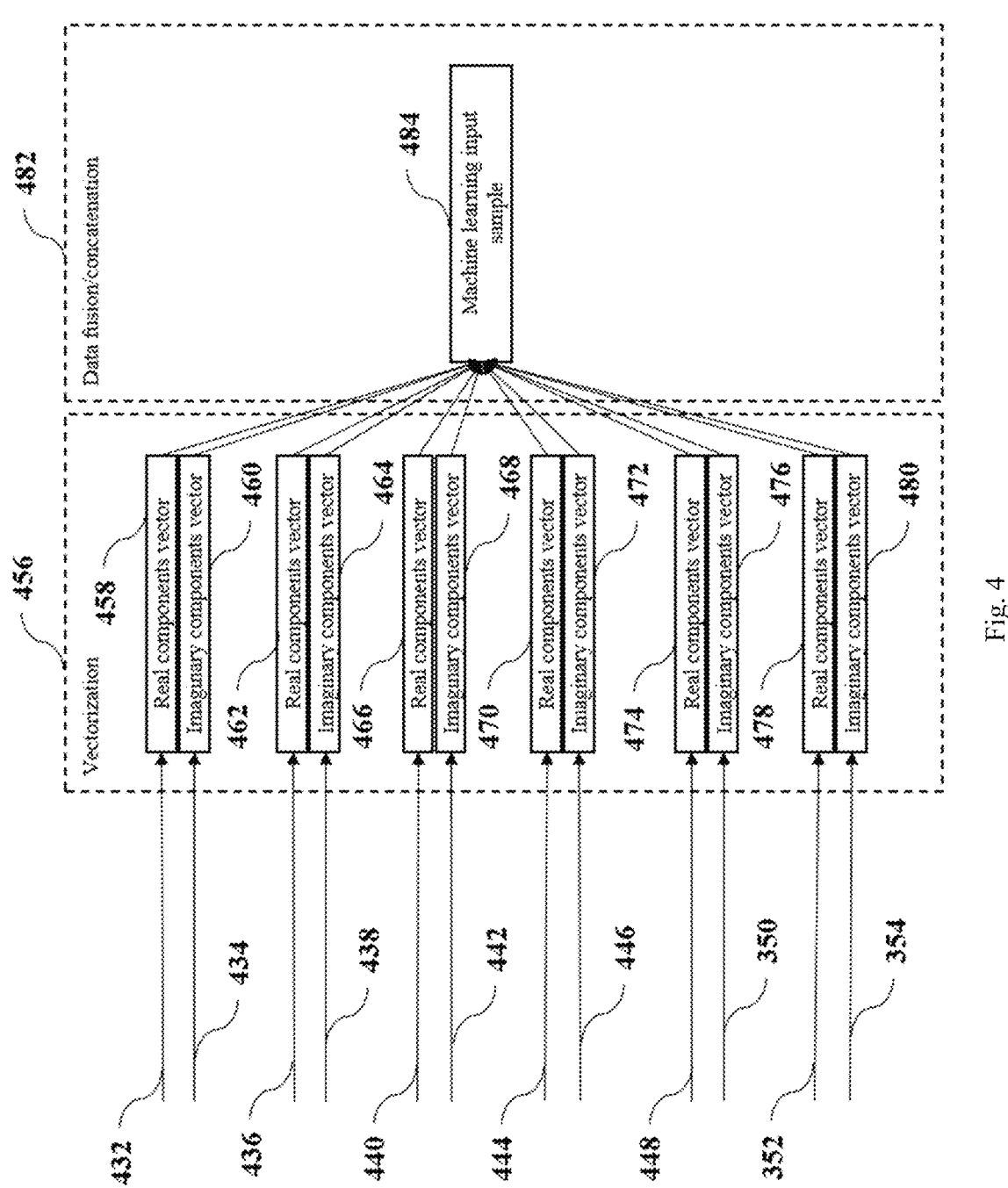
FIG. 4. is a block diagram depicting the feature extraction method for method 1 based on STFT in accordance with the present invention, including second part of the feature extraction procedure covering vectorization and data fusion/concatenation.

FIGS. 3 and 4 shows the feature extraction and data fusion method of the invention described herein based on the short-term Fourier transform. Going from the left to right, first procedural block is collection of the sliding window raw measurements 300 that includes phase voltages and currents collection (in three phased systems it results in six measurements: voltages in phase 1 302, phase 2 304 and phase 3 306, and currents in phase 1 308, phase 2 310 and phase 3 312 for the whole system plus six these measurement sets for per each feeder depending on number of system feeders). Each phase measurement is forwarded in the next block to be processed with the short-time Fourier transform (STFT) 314. Due to the discrete nature of the measured quantities the discrete-time STFT is used in this method, where data is broken into chunks of frames (that usually overlap with each other in order to diminish artifacts at the boundary). Each of these chunks is passed through STFT and the complex result is added to a matrix which records complex value for each point in time and frequency, by using following formula with signal x[n] and window ω[n], (Allen and Rabiner, 1977):

$$STFT\{x[n]\}(m, \omega) \equiv X(m, \omega) = \sum_{n=-\infty}^{\infty} x[n]\omega[n - m]e^{-i\omega n}$$

As a result, for each phase measurement the frequency matrix is obtained that is forwarded to the next procedural block for complex components splitting 330. In this step, each STFT frequency matrix for each phase measurement is divided to real and imaginary components (pairs 332-334, 336-338, 340-342, 344-346, 348-350 and 352-354) of the complex value and forwarded to the next block for vectorization 356. FIG. 4 shows the rest of process. Vectorization block 456 takes these two matrices (pairs 458-460, 462-464, 466-468, 470-472, 474-476 and 478-480) for each phase measurement and vectorizes it. As a result, two vectors for real and imaginary components are produced for each phase measurement. The final step is data fusion/concatenation 482, where all voltage and current measurements for all phases are fused into the machine learning input sample 484 that presents a single vector. Depending on the model (three models shown in FIG. 2), the input to the feature extraction and data fusion block 210 differs. Fault detection and classification model for training 212 and inference 214 takes as inputs voltage and current measurements of the whole monitored system (as AI classification model), faulty feeder detection model for training 216 and inference 218 takes as inputs voltage and current measurements of all feeders (as AI classification model), while the fault location models for training 220 and inference 222 take as inputs voltage and current measurements of a single feeder that they are monitoring (as AI regression model). Regardless of the input types, the feature extraction and data fusion method 210 is same.

Once the feature extraction and data fusion 210 is completed, the preprocessed data are sent as inputs to AI models, namely fault detection and classification model 212, faulty feeder detection model 216 and fault location models 220, as shown in FIG. 2. With target outputs produced in the previous step, all models are trained 228 on server computer 200. These pre-trained models are deployed to the industrial computer 202, as shown in the right-hand side of the FIG. 2. Industrial computer receives real-time measurements of voltage and currents 224, performs the same feature extraction and data fusion method 210 described in FIGS. 3 and 4, and feeds this data to pre-trained models 226. In normal operating scenario, models are receiving inputs that are not triggering any action. If fault occurs, pre-trained model for fault detection and classification 214 detects the fault classifies the fault type 230. This action sends request for information from faulty feeder detection model 218 that detects the faulty feeder 232. The selected faulty feeder requests for information on the fault location 234 on that feeder from the fault location model 222. As a results, the fault in power system is detected, classified, faulty feeder is determined and fault distance from the substation is estimated. After that, these results are triggering circuit breaker trip signal 236 or simply send the information to SCADA/EMS for further action 238.

High-Impedance Faults

In a preferred embodiment, when the layout of the real-world electrical power network comprises at least some underground transmission lines, then the invention's neural network should be specifically trained with a plurality of either simulated or real-world high-impedance faults located at various locations on these underground transmission lines.

Method 2 Based on Kalman Filter Innovation Sequence for Meshed Power System Topologies The Kalman Filter approach helps address certain issues from prior art. Note that in Kalman Filter terminology, the term "innovation" generally means the difference between an observation (e.g. a given measurement) and its predicted value, based on information available at the time. In an optimally adjusted Kalman filter, where the model matches the real system perfectly, the innovation sequence (or output prediction error) resembles white noise. Conversely if the Kalman filter is imperfect, then the innovation sequence will have a non-Gaussian characteristic. So, the "innovation sequence" can be regarded as a measure of steady-state operation of the power system.

Some of the issues with the prior art are that conventional relay protection schemes are not adaptable to dynamic changes in modern power systems that have integrated renewable energy sources such as wind and solar. Additionally, high-impedance faults (such as breaks in underground cables) are not detectable due to small change in the measured current and voltage. Other problems are that achieving good selectivity and sensitivity in detection and localization of fault in complex systems is challenging with traditional protection schemes. Further, existing protection schemes often do not work well in islanded operation of microgrids in the system. Additionally, deploying advanced protection technologies is expensive as it requires large investment in protection equipment.

Here the invention description, design, and objectives are generally similar to that previously described above. However here, the local industrial computer has a pre-trained artificial intelligence model that is used for inference: fault detection, classification, faulty feeder selection and fault localization, calculated space state model of the monitored system and Kalman filter that calculates the innovation sequence. The server computer is again used for training, but this time and has a pre-trained artificial intelligence model based on simulation scenarios that is regularly updated and trained with new data, calculated space state model of the monitored system and Kalman filter that calculates the innovation sequence.

Further, in this embodiment, the collected measurements of currents and voltages are preprocessed to extract features from the raw measurements by using Kalman filter innovation sequence in both server and industrial computer.

The main components and sub-systems are as previously described, and the system capabilities are also as previously described.

In some embodiments, the monitoring computer system disclosed herein may be used to analyze the various voltage and current measurements over at least some of the various times and locations, and types of said fault by an alternate approach.

Here, as before, for at least some of these various times and locations and types of said fault, the system can analyze the voltage and current measurements according to at least one sliding time window, again producing sliding window raw measurements for at least some of said location. As before, these sliding window raw measurements can comprise, on a location and fault basis, the voltages and currents as a function of time at that given location and fault type.

However, according to this alternate method, for at least some of these locations, the sliding window raw measurements are analyzed using a Kalman filter. This Kalman filter is generally configured according to at least one state space model comprising at least one nonlinear power system model and a state space power system model.

The method and system herein disclosed uses this Kalman filter to analyze these sliding window raw measurements by determining at least one (Kalman filter type) innovation sequence for at least some of these locations and producing at least one innovation sequence vector comprising a plurality of these innovation sequences over a plurality of said locations.

The method and system herein disclosed then uses at least some of these innovation sequence vectors, and their corresponding locations, for either training the at least one artificial intelligence system, and/or as input to the monitoring computer system.

As will be discussed, this later method is particularly appropriate when the electrical power network is a meshed type network.

Figure 5:
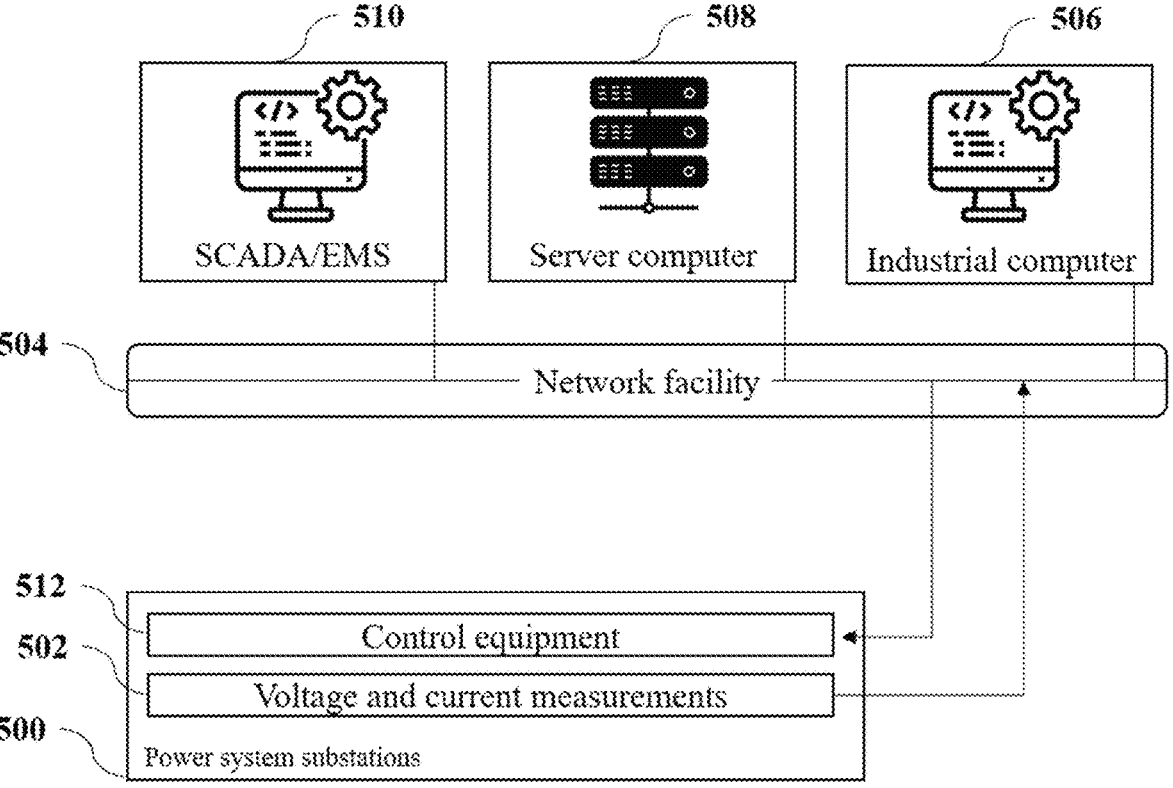
FIG. 5. is diagram illustrating a preferred embodiment of the invention using method 2, depicting essential operative elements and the equipment of the system and integration in the power system in accordance with the present invention.

FIG. 5 shows the preferred embodiment of the invention described herein connected to the power system. The method is intended for the meshed system topologies, but there are no limitations for its usage on radial power systems. Power system substations 500 in modern power systems as a rule have measurements of voltages 502 and currents in all feeders. These measurements are usually obtained through voltage and currents transformers, but also through more advanced measuring equipment. If no compatible measuring equipment is installed, new additional measurements can be required. All measurements are monitored over the predefined sliding time window. With partial measurements, the system will be able to detect that the fault happened, but protection system selectivity will be less precise. Regardless of the measuring method, the voltages and currents are collected, digitalized and sent via communication interface 504 to local industrial computer 506, cloud server computer 508 and SCADA/EMS system 510 (if there is a SCADA/EMS). Local industrial computer has a pre-trained artificial intelligence model that is used for inference. Inference model takes the measurements and based on them determines if the fault happened (fault detection), which type of fault happened (classification), where the fault happened (faulty line selection) and at what distance from the substation the fault happened (fault localization). Model response time is in range of couple milliseconds on standard industrial computer hardware, which means it can be used for real time protection coordination and sending trip signals to control equipment 512. The method described herein procedurally is same as method 1 in the area transactions between measuring equipment, local industrial computer, server computer, SCADA/EMS and control equipment (circuit breakers), and transactions described in FIG. 2. The main difference is that measurements are collected from multiple measuring points (substations) in the power system and the feature extraction and data fusion method that is in this method is based on Kalman Filter Innovation Sequence.

Figure 6:
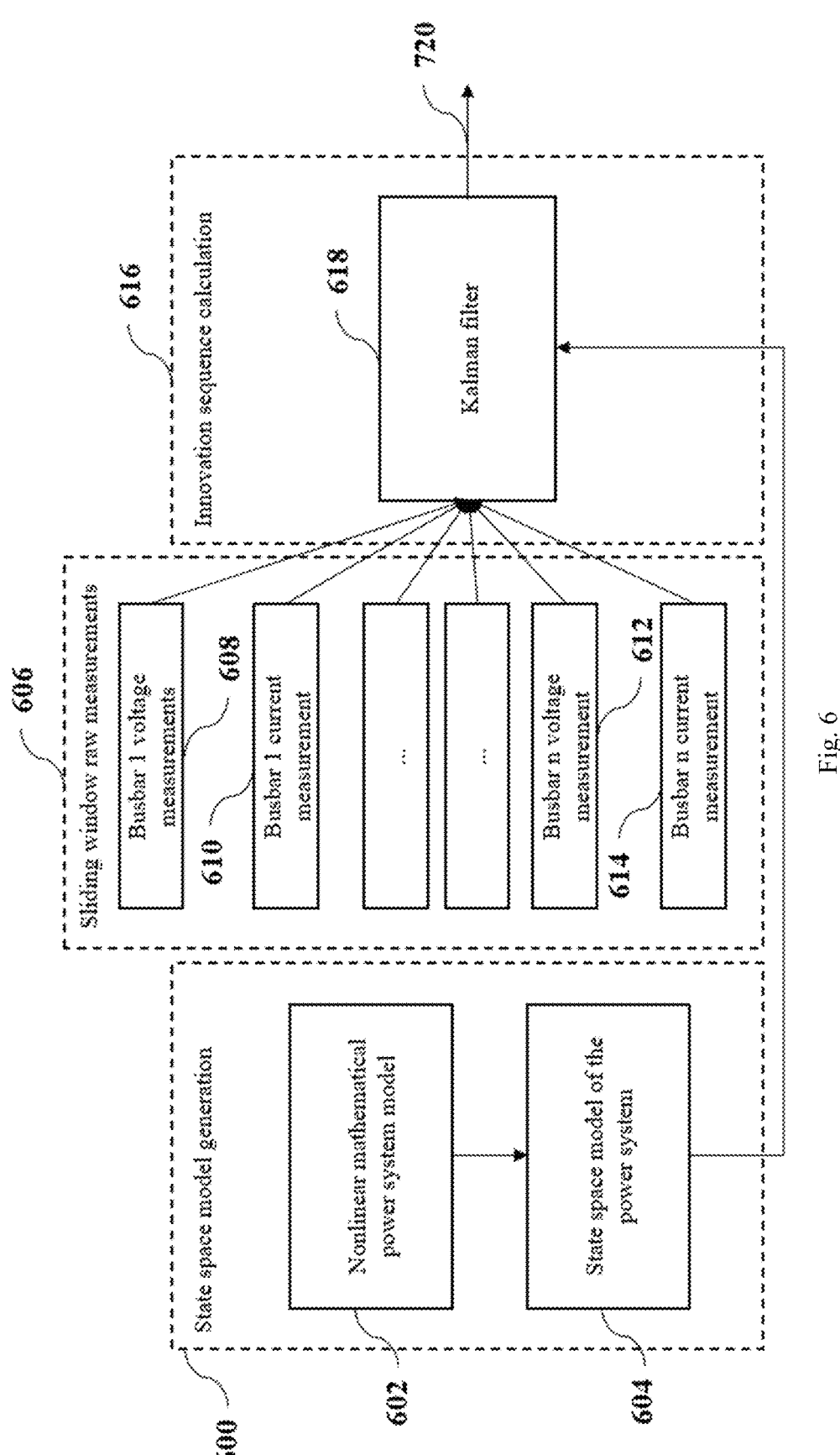
FIG. 6. is a block diagram depicting the feature extraction method for method 2 based on Kalman filter innovation sequence in accordance with the present invention, including first part of the feature extraction procedure covering state space model generation, sliding window raw measurements and innovation sequence calculation.
Figure 7:
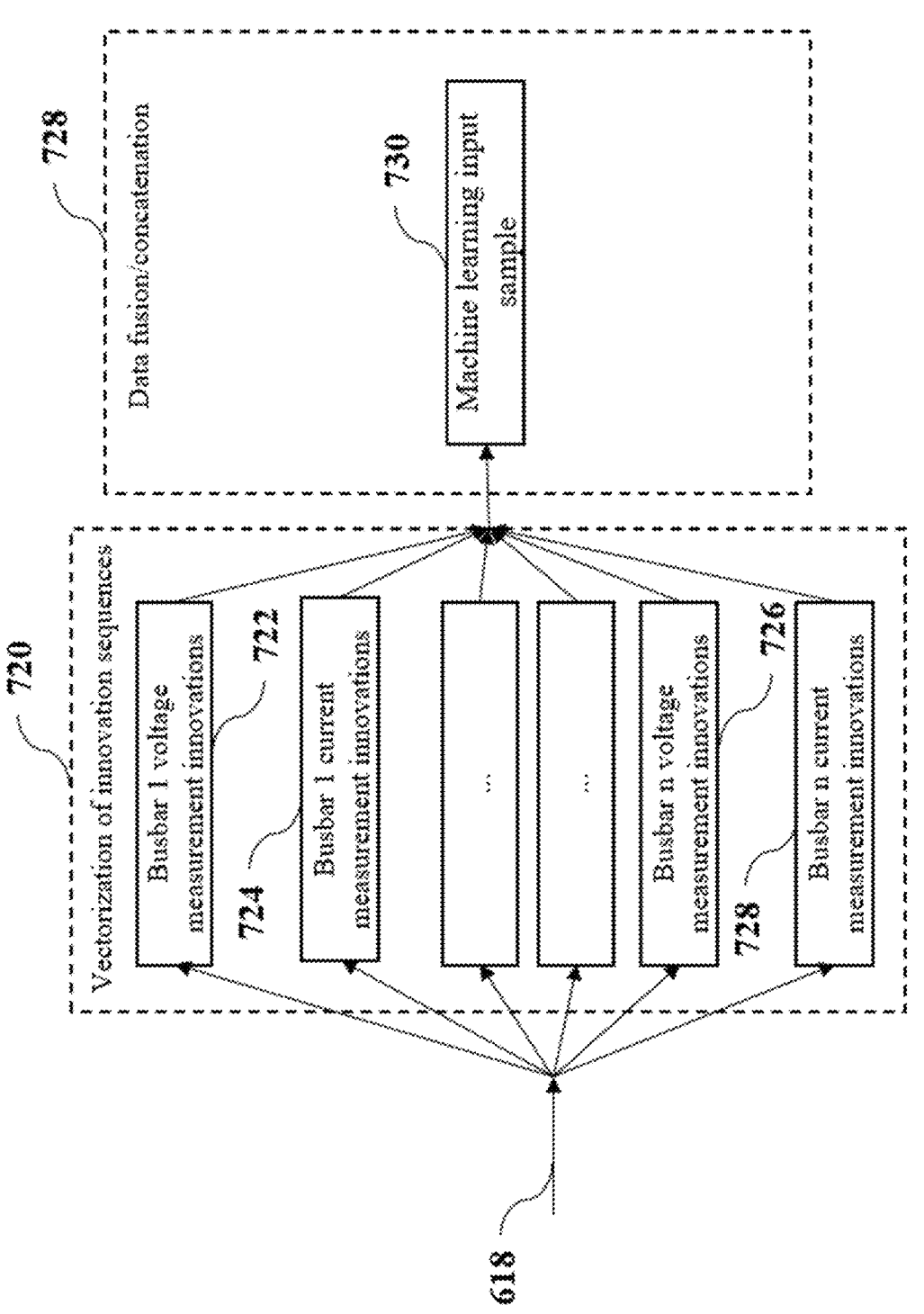
FIG. 7. is a block diagram depicting the feature extraction method for method 2 based on Kalman filter innovation sequence in accordance with the present invention, including second part of the feature extraction procedure covering vectorization of innovation sequences and data fusion/concatenation.

FIGS. 6 and 7 shows the feature extraction and data fusion method of the invention described herein based on the Kalman Filter Innovation Sequence. Going from the left to right, first procedural block is generation of the linearized state space representation around steady-state operating point 600 from the nonlinear mathematical power system model 602. Once these mathematical computations are performed, the state space model 604 (matrices) are forwarded to the time-varying Kalman filter. Second block represents the collection of the sliding window raw measurements 606 that includes phase voltages 608 and currents collection 610 (in three phased systems it results in six measurements per busbar) from busbar 1 (pair 608-610) to busbar n (pair 612-614). All measurements are forwarded in the next block to be processed with the Kalman filter in order to calculate the innovation sequence 616 for each measurement. The innovation sequence in moment k in Kalman filter 618 can be defined as (Ishihara et al., 2006):

$$\hat{y}_k = z_k - H_k \hat{x}_{k|k-1}$$

Given that $H_k$ is observation model, $\hat{x}_{k|k-1}$ state estimation and $z_k$ measurement. As a result, for each phase measurement of voltages and currents, innovation sequence vectors are created over the predefined sliding time window for busbars 1 (pair 722-724) to busbar n (pair 726-728). In the next block, these multiple innovation sequence vectors are vectorized per each busbar (and finally fused/concatenated 728 in one single machine learning input sample vector 730. Depending on the model (three models shown in FIG. 2), the input to the feature extraction and data fusion block differs. Fault detection and classification model and faulty feeder detection model take as inputs voltage and current measurements from all busbars of the monitored system, while the fault location models take as inputs voltage and current measurements of two substations connecting the faulty line. Regardless of the input types, the feature extraction and data fusion method is same. The rest of the algorithm shown in FIG. 2. is same as for method 1. As a results, the fault in power system is detected, classified, faulty feeder is determined and fault distance from the substation is estimated. After that, these results are triggering circuit breaker trip signal to isolate the faulty line or simply send the information to SCADA/EMS for further action.

Discussion of Simulation Techniques:

In some embodiments, the artificial intelligence system can be further pre-trained by creating a computer model of the real-world electrical power network. Here, a computer model that is more realistic (in terms of real-world physical effects, such as how the shape of the fault signal waveform becomes progressively distorted as the fault signal waveform travels down various lengths and types of power networks) will generally give superior results.

Thus, in some embodiments, this computer model may be configured to mimic at least the electrical network topology, line types, and cable distances along said electrical network topology, and electrical equipment types that are used in at least one real-world electrical power network. This is because different types of power lines, different distances, and different electrical equipment types between the actual location of a given fault and the location of the signal detection equipment will impact the results. If the fault is located a long distance away from the measuring equipment, or if the fault waveform must propagate through various network topologies and equipment types before it reaches the measuring equipment, then the results will differ. An AI system trained on more realistic data is more likely to give accurate results.

Thus, in some embodiments, the line types encoded in the computer model may comprise any of main power grid lines, secondary busbar lines, feeder lines, overhead transmission lines, subtransmission lines, and underground transmission lines. Further, the electrical equipment types may comprise any of transformers, circuit breakers, and switches. Ideally, the lengths and locations of these lines and information in the computer model should realistically approximate those in the real-world electrical power network.

According to the disclosed system and method, at least one computerized circuit simulator can be used to simulate an impact of at least some electrical faults on at least some of the various voltage and current measurements. In this simulation, the electrical faults may be chosen from the group consisting of short-circuits, high-impedance faults, inrush current faults, infeed currents, bidirectional power flow faults, isolated equipment failure, and cascading equipment failure. The various results of this computerized circuit simulator working on this computer model can be used to create at least one failure simulation database. This failure simulation database can then be used to train the artificial intelligence system.

In some embodiments, the at least one computerized circuit simulator can comprise or use any of MATLAB, EMTP, ATP, PSS, SIM600, Backend, and Python to simulate an impact of at least some electrical faults on at least some of the various plurality of voltage and current measurements.

Note that in some embodiments, at least one computerized circuit simulator may be configured to model an impact of at least some of the line types and at least some of the electrical equipment types, as well as at least some electrical faults and at least some locations on at least some of the various voltage and current measurements.

Figure 8:
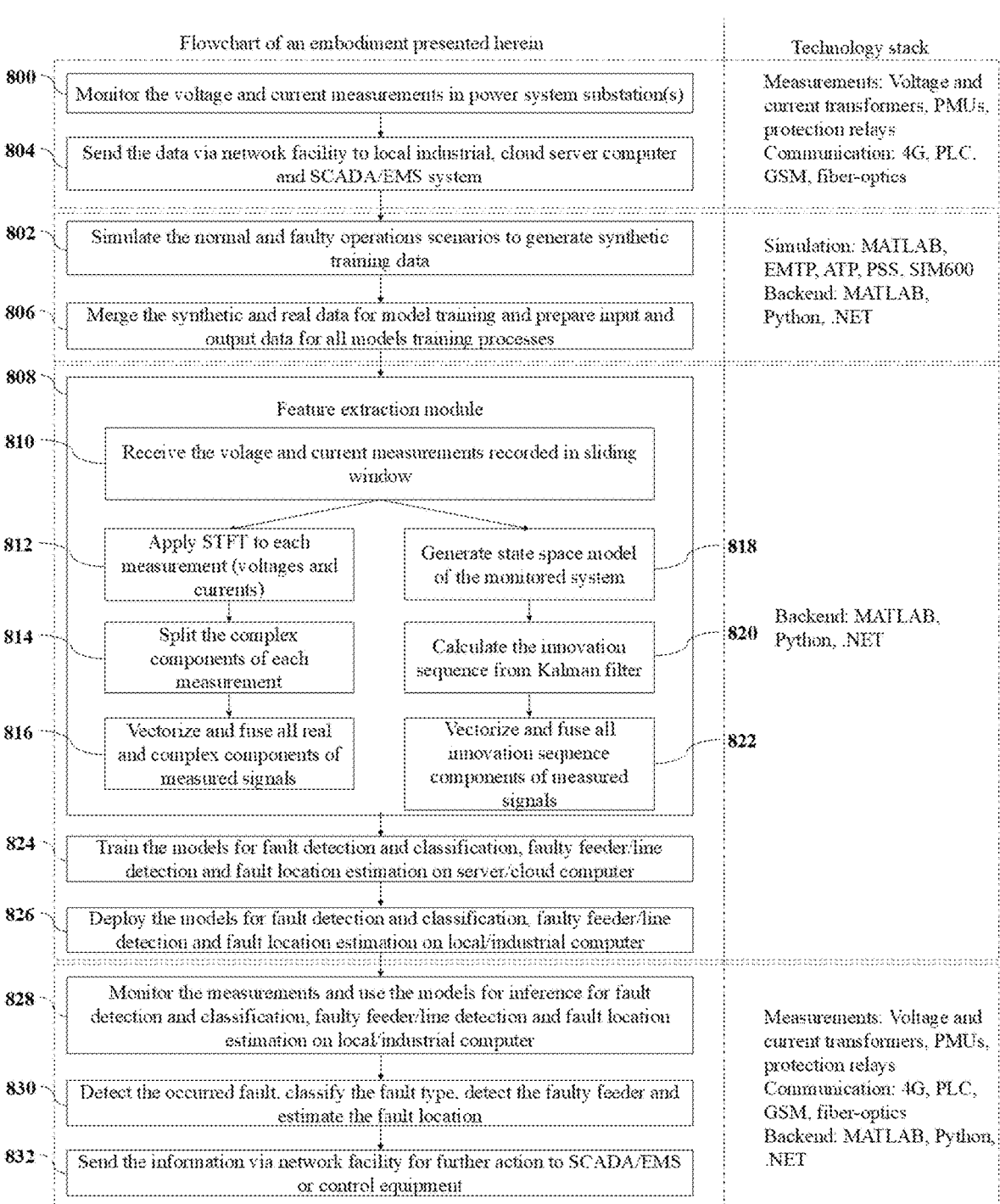
FIG. 8. is a flowchart diagram showing a representation of the transaction flow, application of logic and examples of technology applied at each step of the invention described herein.

FIG. 8 presents a flowchart diagram showing a representation of the transaction flow, application of logic and examples of technology applied at each step of the invention described herein. For any potential use case, first step is to measure voltages and currents in power system substation(s) 800 to obtain real measurements and generate synthetic data from simulation scenarios 802, send them over network facility 804, and merge the synthetic and real data 806. Simulating faulty scenarios is common approach in power system protection domain, as real equipment should ideally never be stressed with such conditions. When data are fused, feature extraction procedure 808 explained in text above is started. Measured voltages and currents are tracked in the sliding window 810, and preprocessed depending on the method that is used. Use case includes following split: if the monitored grid is radial, STFT is applied to measurements 812, complex components are split 814, and after that vectorized and fused 816; and if the monitored grid is meshed, state space model of the system is generated 818, innovation sequence from Kalman filter calculated 820, and after that vectorized and fused 822. Prepared datasets are sent for models training 824 and deployment 826. With constant monitoring of real measurements 828, the method provides accurate information 830 for system operators or for automatic protection and control equipment 832.

In addition to simulated data, real-world experience may also be used to further train the system.

In addition to the training methods discussed previously, in some embodiments, the artificial intelligence system may be trained by again creating a computer model of the real-world electrical power network. As before, this is also to enable the system to better understand the physics of fault signal propagation in the real-world electrical power network.

In a preferred embodiment, this computer model is configured to mimic at least an electrical network topology, line types, and cable distances along the electrical network topology, as well as the electrical equipment types that are used in the real-world electrical power network. These line types may comprise any of main power grid lines, secondary busbar lines, feeder lines, overhead transmission lines, subtransmission lines, and underground transmission lines. The electrical equipment types may comprise any of transformers, circuit breakers, and switches.

Here, however, the system works by creating a previous experience record of the at least one real-world electrical power network. This previous experience record will typically comprise a database consisting of at least some previously observed electrical faults, fault times, and fault network locations, as well as previously observed voltage and current measurements at these fault times. This thus creates at least one "previous experience database."

Here, the disclosed system and method uses this computer model and the previous experience database to train the artificial intelligence system further.

The benefit of this approach is that the AI system can use the computer model to generalize the results from the previous experience database. For example, if a certain type of present fault has measured properties on a second sensor that are similar to a historical fault that the AI system knows was located on a first feeder line 1 kilometer away from a given first sensor, then the AI system can learn from experience that this present fault may be located on a second feeder line about 1 kilometer away from the second sensor. In other words, the computer model helps the AI system learn from experience.

In some embodiments, the training process for regression and classification models may integrate with, and/or include, various advanced AI technologies, including but not limited to hyperparameter optimization algorithms such as Bayesian optimization, genetic algorithms, and grid search, as well as ensemble learning techniques like random forests, gradient boosting machines (GBM), and stacking. For preprocessing, advanced data preparation techniques, including feature engineering, normalization, and dimensionality reduction via principal component analysis (PCA), may be employed to prepare the raw data for modeling. Once preprocessing is complete, the system may use a variety of regression algorithms such as linear regression, support vector regression (SVR), and neural network-based regression, alongside classification algorithms like logistic regression, decision trees, and k-nearest neighbors (KNN). Additionally, more complex models like support vector machines (SVM), XGBoost, LightGBM, CatBoost, and deep learning architectures may be utilized for both tasks. Each model undergoes a rigorous evaluation using cross-validation techniques to assess their performance on key metrics like mean squared error (MSE) and R-squared for regression, and accuracy, precision, recall, and F1-score for classification. To enhance accuracy and robustness, Selected models may be optimized through hyperparameter tuning and ensemble methods, such as bagging and boosting.

The invention claimed is:

1. A method of automatically detecting faults in at least one non-virtual electrical power network, said method comprising:

using a plurality of voltage and current measurement devices to obtain a plurality of voltage and current measurements at a plurality of times and locations in said non-virtual electrical power network, digitalizing and transmitting said plurality of voltage and current measurements via at least one communications interface as input to at least one monitoring computer system;

said monitoring computer system configured to use at least one artificial intelligence system to analyze said plurality of voltage and current measurements for a presence of at least one feature associated with at least one type of fault;

wherein, for at least some of said plurality of times and locations and types of said fault, said analysis includes analyzing said voltage and current measurements according to at least one sliding time window, producing sliding window raw measurements for at least some of said locations;

said faults comprising short-circuits, high-impedance faults, and at least one other type of fault chosen from the group consisting of inrush current faults, infeed currents, bidirectional power flow faults, isolated equipment failure, and cascading equipment failure;

said at least one artificial intelligence system comprising at least one machine learning or neural network trained with at least some information about layouts, components, and electrical properties of said at least one non-virtual electrical power network, as well as information about how at least one type of said fault alters at least some said plurality of voltage and current measurements; and using said at least one artificial intelligence system to output information about any of the types, network locations, times, and severity of said fault.

2. The method of claim 1, further using said monitoring computer system to analyze said plurality of voltage and current measurements over at least some of said plurality of times and locations, and types of said fault by the steps of:

for at least some of said plurality of times and locations and types of said fault, said sliding window raw measurements comprise phases of voltage and currents as a function of time at said location and type of said fault;

for at least some said locations, analyzing said sliding window raw measurements using a Short-Time Fourier Transform (STFT), producing STFT frequency matrices, and using said STFT frequency matrices to determine their corresponding real component matrices and imaginary component matrices for at least some said locations and types of said faults; and vectorizing said real component matrices and said imaginary component matrices, producing a plurality of real component vectors and imaginary components vectors for at least some said locations and types of said fault;

using at least some of said plurality of real component vectors and imaginary component vectors, and their corresponding locations, for any of training at least one artificial intelligence system, and as input to said monitoring computer system.

3. The method of claim 2, wherein said electrical power network comprises a radial system topology.

4. The method of claim 1, further using said monitoring computer system to analyze said plurality of voltage and current measurements over at least some of said plurality of times and locations, and types of said fault by the steps of:

for at least some of said plurality of times and locations, and types of said fault, said sliding window raw measurements comprise phases of voltage and currents as a function of time at said location and type of said fault;

for at least some said locations, analyzing said sliding window raw measurements using a Kalman filter, said Kalman filter configured according to at least one state space model comprising at least one nonlinear power system model and a state space power system model;

using said Kalman filter to analyze said sliding window raw measurements by determining at least one innovation sequence for at least some said locations, and producing at least one innovation sequence vector comprising a plurality of said innovation sequences over a plurality of said locations;

and using at least some of said innovation sequence vectors, and their corresponding locations, for any of training at least one said artificial intelligence system, and as input to said monitoring computer system.

5. The method of claim 4, wherein said electrical power network is a meshed type network.

6. The method of claim 1, further pre-training said at least one artificial intelligence system by creating a computer model of said at least one non-virtual electrical power network, said computer model configured to mimic at least an electrical network topology, line types, and cable distances along said electrical network topology, and electrical equipment types that are used in said at least one non-virtual electrical power network;

said line types comprise any of main power grid lines, secondary busbar lines, feeder lines, overhead transmission lines, subtransmission lines, and underground transmission lines, and said electrical equipment types comprise any of transformers, circuit breakers, and switches;

using at least one computerized circuit simulator to simulating an impact of at least some electrical faults on at least some of said plurality of voltage and current measurements; said electrical faults chosen from the group consisting of short-circuits, high-impedance faults, inrush current faults, infeed currents, bidirectional power flow faults, isolated equipment failure, and cascading equipment failure, thus creating at least one failure simulation database;

and using said failure simulation database to train said artificial intelligence system.

7. The method of claim 6, wherein at least one said computerized circuit simulator uses any of MATLAB, EMTP, ATP, PSS, SIM600, Backend, and Python to simulate an impact of at least some electrical faults on at least some of said plurality of voltage and current measurements.

8. The method of claim 6, wherein said at least one computerized circuit simulator is configured to model an impact of at least some of said line types and at least some of said electrical equipment types, as well as at least some said electrical faults and at least some locations on at least some of said plurality of voltage and current measurements.

9. The method of claim 1, further training said at least one artificial intelligence system by creating a computer model of said at least one non-virtual electrical power network, said computer model configured to mimic at least an electrical network topology, line types, and cable distances along said electrical network topology, and electrical equipment types that are used in said at least one non-virtual electrical power network;

said line types comprise any of main power grid lines, secondary busbar lines, feeder lines, overhead transmission lines, subtransmission lines, and underground transmission lines, and said electrical equipment types comprise any of transformers, circuit breakers, and switches;

creating a previous experience record of said at least one non-virtual electrical power network, said previous experience record comprising a database consisting of at least some previously observed electrical faults, fault times, and fault network locations, as well as previously observed voltage and current measurements at said fault times, thus creating at least one previous experience database;

and using said computer model and said previous experience database to further train said artificial intelligence system.

10. The method of claim 1, wherein said output information comprises any of trip signals to protection equipment and signals to human system operators.

11. The method of claim 1, wherein said at least some information about said layout, components, and electrical properties of said at least one non-virtual electrical power network, as well as information about how at least one type of said fault alters at least some said plurality of voltage and current measurements comprises any of:

(a) Information encoded in said machine learning or neural network; and (b) At least one computerized circuit simulator operating upon at least one computer model of at least a portion of said layout, components, and electrical properties of said at least one non-virtual electrical power network.

12. The method of claim 1, wherein said at least one machine learning or neural network comprises any of at least one large language model, convolutional neural network, generative adversarial network, other generative AI, and other trainable neural network hardware and software.

13. The method of claim 1, wherein said layout of said at least one non-virtual electrical power network comprises at least some underground transmission lines, and wherein said machine learning or neural network is specifically trained with a plurality of either simulated or non-virtual high-impedance faults located at various locations on said least some underground transmission lines.

14. A method of automatically detecting faults in at least one non-virtual electrical power network, said method comprising:

using a plurality of voltage and current measurement devices to obtain a plurality of voltage and current measurements at a plurality of times and locations in said non-virtual electrical power network, digitalizing and transmitting said plurality of voltage and current measurements via at least one communications interface as input to at least one monitoring computer system;

said monitoring computer system configured to use at least one artificial intelligence system to analyze said plurality of voltage and current measurements for a presence of at least one feature associated with at least one type of fault;

wherein at least one of said at least one artificial intelligence system was previously pre-trained by creating a computer model of said at least one non-virtual electrical power network, said computer model configured to mimic at least an electrical network topology, line types, and cable distances along said electrical network topology, and electrical equipment types that are used in said at least one non-virtual electrical power network;

said faults comprising short-circuits, high-impedance faults, and at least one other type of fault chosen from the group consisting of inrush current faults, infeed currents, bidirectional power flow faults, isolated equipment failure, and cascading equipment failure;

said at least one artificial intelligence system comprising at least one machine learning or neural network trained with at least some information about layouts, components, and electrical properties of said at least one non-virtual electrical power network, as well as information about how at least one type of said fault alters at least some said plurality of voltage and current measurements; and using said at least one artificial intelligence system to output information about any of the types, network locations, times, and severity of said fault.

15. A method of automatically detecting faults in at least one non-virtual electrical power network, said method comprising:

using a plurality of voltage and current measurement devices to obtain a plurality of voltage and current measurements at a plurality of times and locations in said non-virtual electrical power network, digitalizing and transmitting said plurality of voltage and current measurements via at least one communications interface as input to at least one monitoring computer system;

said monitoring computer system configured to use at least one artificial intelligence system to analyze said plurality of voltage and current measurements for a presence of at least one feature associated with at least one type of fault;

said faults comprising short-circuits, high-impedance faults, and at least one other type of fault chosen from the group consisting of inrush current faults, infeed currents, bidirectional power flow faults, isolated equipment failure, and cascading equipment failure;

said at least one artificial intelligence system comprising at least one machine learning or neural network trained with at least some information about layouts, components, and electrical properties of said at least one non-virtual electrical power network, as well as information about how at least one type of said fault alters at least some said plurality of voltage and current measurements; and using said at least one artificial intelligence system to output information about any of the types, network locations, times, and severity of said fault;

further training said at least one artificial intelligence system by creating a computer model of said at least one non-virtual electrical power network, said computer model configured to mimic at least an electrical network topology, line types, and cable distances along said electrical network topology, and electrical equipment types that are used in said at least one non-virtual electrical power network;

said line types comprise any of main power grid lines, secondary busbar lines, feeder lines, overhead transmission lines, subtransmission lines, and underground transmission lines, and said electrical equipment types comprise any of transformers, circuit breakers, and switches;

creating a previous experience record of said at least one non-virtual electrical power network, said previous experience record comprising a database consisting of at least some previously observed electrical faults, fault times, and fault network locations, as well as previously observed voltage and current measurements at said fault times, thus creating at least one previous experience database;

and using said computer model and said previous experience database to further train said artificial intelligence system.

\* \* \* \* \*